US009029182B2

(12) United States Patent
Aoki (10) Patent No.: US 9,029,182 B2
(45) Date of Patent: May 12, 2015

(54) METHOD OF MANUFACTURING SOLID-STATE IMAGE SENSOR

(71) Applicant: Canon Kabushiki Kaisha, Tokyo (JP)

(72) Inventor: Takeshi Aoki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/014,716

(22) Filed: Aug. 30, 2013

(65) Prior Publication Data

US 2014/0065753 A1 Mar. 6, 2014

(30) Foreign Application Priority Data

Sep. 6, 2012 (JP) .................................. 2012-196639

(51) Int. Cl.
| | |
|---|---|
| *H01L 31/18* | (2006.01) |
| *H01L 27/146* | (2006.01) |
| *H01L 21/762* | (2006.01) |
| *H01L 21/8234* | (2006.01) |

(52) U.S. Cl.
CPC ............ *H01L 31/18* (2013.01); *H01L 27/1464* (2013.01); *H01L 27/1463* (2013.01); *H01L 21/76224* (2013.01); *H01L 21/823481* (2013.01); *H01L 21/76229* (2013.01); *H01L 27/14643* (2013.01)

(58) Field of Classification Search
CPC ...................... H01L 27/1463; H01L 27/14643; H01L 27/1464; H01L 21/76224; H01L 21/76229; H01L 21/823481
See application file for complete search history.

(56) References Cited

U.S. PATENT DOCUMENTS

| | | | | |
|---|---|---|---|---|
| 7,468,307 | B2 * | 12/2008 | Hartner et al. ................ | 438/430 |
| 8,216,947 | B2 | 7/2012 | Lee et al. | |
| 2009/0042396 | A1 * | 2/2009 | Park et al. ..................... | 438/700 |
| 2009/0256226 | A1 | 10/2009 | Tatani et al. | |
| 2010/0167449 | A1 * | 7/2010 | Yoshihara ...................... | 438/59 |
| 2011/0204433 | A1 * | 8/2011 | Fujita et al. ................... | 257/326 |
| 2011/0240835 | A1 * | 10/2011 | Sawayama et al. ........ | 250/214.1 |
| 2011/0269259 | A1 | 11/2011 | Tatani et al. | |
| 2012/0252185 | A1 | 10/2012 | Lee et al. | |

FOREIGN PATENT DOCUMENTS

| | | |
|---|---|---|
| JP | 2004-221485 A | 8/2004 |
| JP | 2006-329295 A | 12/2006 |
| JP | 2009-64980 A | 3/2009 |
| JP | 2009-088447 A | 4/2009 |
| JP | 2009-272596 A | 11/2009 |
| JP | 2009-272597 A | 11/2009 |
| JP | 2009-302573 A | 12/2009 |
| JP | 2010-103538 A | 5/2010 |
| JP | 2010-219543 A | 9/2010 |

* cited by examiner

*Primary Examiner* — Bac Au
(74) *Attorney, Agent, or Firm* — Fitzpatrick, Cella, Harper & Scinto

(57) ABSTRACT

A method of manufacturing a solid-state image sensor having a pixel region and a peripheral circuit region, includes forming an oxide film on a semiconductor substrate, forming an insulating film on the oxide film, forming a first opening in the insulating film and the oxide film in the peripheral circuit region, forming a trench in the semiconductor substrate in the peripheral circuit region by etching the semiconductor substrate through the first opening using the insulating film as a mask, forming a second opening in the insulating film to penetrate through the insulating film in the pixel region and to reach a predetermined depth of the oxide film, and forming insulators in the trench and the second opening.

20 Claims, 7 Drawing Sheets

METHOD OF MANUFACTURING SOLID-STATE IMAGE SENSOR

BACKGROUND OF THE INVENTION

1. Field of the Invention

The present invention relates to a method of manufacturing a solid-state image sensor.

2. Description of the Related Art

A solid-state image sensor such as a CCD sensor or CMOS sensor is used as that mounted in cameras such as a video camera and digital still camera. In recent years, along with an increase in number of pixels and a reduction of a chip size, a pixel size in the solid-state image sensor is reduced. Such pixel size reduction causes transition of an element isolation method from a LOCOS (Local Oxidation of Silicon) method to an STI (Shallow Trench Isolation) method.

The STI method suffers a problem of image signal noise caused by defects at an interface between a silicon substrate and silicon oxide film in the vicinity of trenches and a neighboring portion of the interface. As a measure against such problem, a technique for forming different STI structures in a pixel region and peripheral circuit region is available. Japanese Patent Laid-Open No. 2009-272597 discloses a method of manufacturing a solid-state image sensor in which an embedding depth of an element isolation portion of an STI structure arranged in a pixel portion is shallower than that of an element isolation portion of an STI structure arranged in a peripheral circuit portion. In the manufacturing method described in Japanese Patent Laid-Open No. 2009-272597, an insulating film of the peripheral circuit portion is etched through openings of a resist mark, thereby forming trenches for the STI structure of the peripheral circuit portion. Then, after the resist mark is removed, a new resist mark is formed, and an insulating film of the pixel portion is etched through openings of the new resist mark, thereby forming trenches for the STI structure of the pixel portion.

With the manufacturing method described in Japanese Patent Laid-Open No. 2009-272597, after the trenches for the STI structure of the peripheral circuit portion are completed, the resist mask used to form the trenches is removed. As can be seen from this, in the manufacturing method described in Japanese Patent Laid-Open No. 2009-272597, the thickness of the resist mask used to form the trenches for the STI structure of the peripheral circuit portion is decided so that the resist mask is left after formation of the trenches is completed by etching. Therefore, as the peripheral circuit portion and pixel portion are further miniaturized, an aspect ratio (height/width) of the resist mask is increased, and the resist mask is readily collapsed. The resist mask can be prevented from being collapsed by reducing the aspect ratio using a thin resist mask. In this case, however, a resist film may disappear during etching for trench formation.

SUMMARY OF THE INVENTION

The present invention provides a method advantageous to form minute element isolation having different structures in a pixel region and peripheral circuit region.

One of the aspects of the present invention provides a method of manufacturing a solid-state image sensor having a pixel region and a peripheral circuit region, comprising: forming an oxide film on a semiconductor substrate; forming an insulating film on the oxide film; forming a first opening in the insulating film and the oxide film in the peripheral circuit region; forming a trench in the semiconductor substrate in the peripheral circuit region by etching the semiconductor substrate through the first opening using the insulating film as a mask; forming a second opening in the insulating film to penetrate through the insulating film in the pixel region and to reach a predetermined depth of the oxide film; and forming insulators in the trench and the second opening.

Further features of the present invention will become apparent from the following description of exemplary embodiments with reference to the attached drawings.

DESCRIPTION OF THE EMBODIMENTS

A manufacturing method of a solid-state image sensor according to the present invention will be described by way of its embodiment hereinafter with reference to the accompanying drawings.

Figure 1:
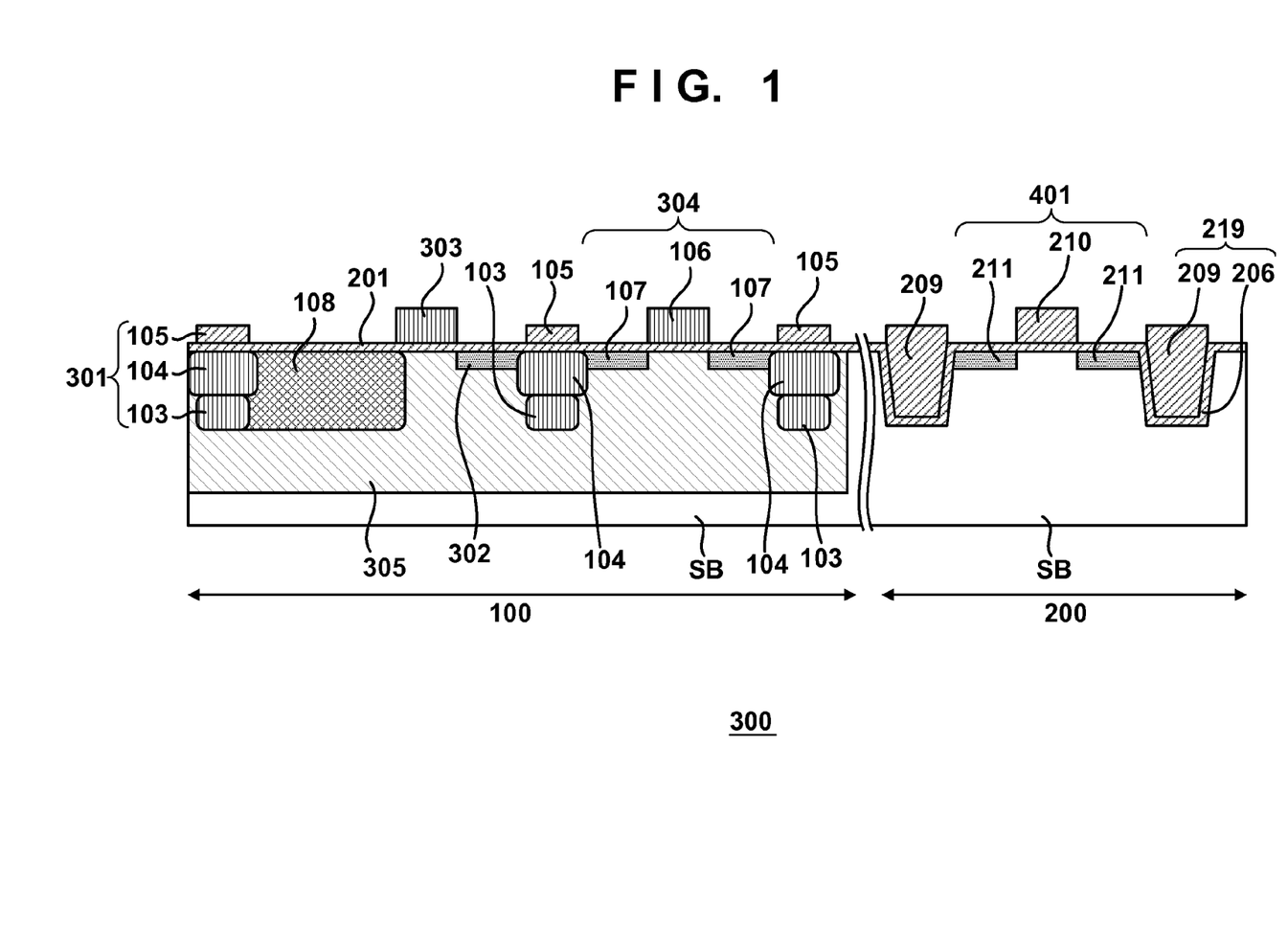
FIG. 1 is a sectional view of a solid-state image sensor which can be manufactured by a manufacturing method according to the present invention.

FIG. 1 is a sectional view of a solid-state image sensor 300 which can be manufactured by a manufacturing method according to the present invention. Note that in FIG. 1, elements such as contacts, wiring layers, color filters, and microlenses are omitted for the sake of simplicity. The solid-state image sensor 300 includes a pixel region 100 and peripheral circuit region 200. Elements of the solid-state image sensor 300 are formed on, for example, a semiconductor substrate SB of a first conductivity type. The pixel region 100 is formed in, for example, a well 305 of a second conductivity type formed in the semiconductor substrate SB. Note that the first conductivity type is an n type, and the second conductivity type is a p type. However, contrary to this, the first conductivity type may be a p type, and the second conductivity type may be an n type.

The pixel region 100 can include a photoelectric converter (for example, photodiode) 108, transfer gate 303, floating diffusion 302, reset transistor 304, and amplifier transistor (not shown). The reset transistor 304 resets a potential of the floating diffusion 302. The photoelectric converter 108 includes, for example, a semiconductor region of the first conductivity type. The photoelectric converter 108 photoelectrically converts incident light, and accumulates charges generated by the photoelectric conversion. The transfer gate 303 forms a channel used to transfer the charges accumulated on the photoelectric converter 108 to the floating diffusion 302 between the photoelectric converter 108 and floating diffusion 302. The potential of the floating diffusion 302 changes when charges are transferred from the photoelectric converter 108 through the channel. The amplifier transistor outputs a signal according to the potential of the floating diffusion 302 onto a column signal line. In this manner, a signal is read out from the photoelectric converter 108. In this case, when an etching damage, metal impurity, crystal lattice distortion, crystal defect, or the like exists on or in the vicinity of the photoelectric converter 108, a dark current may be generated. The dark current may increase noise in a signal read out from that pixel.

The pixel region 100 has an element isolation 301 which isolates elements (the photoelectric converter 108 and transistors such as the reset transistor 304) from each other. The element isolation 301 includes an insulator 105, first channel stop region 103, and second channel stop region 104. The insulator 105 is arranged on a flat oxide film 201 which covers the semiconductor substrate SB in the pixel region 100. The second channel stop region 104 is arranged to be in contact with the oxide film 201 under the oxide film 201 in a region where the insulator 105 is arranged. The first channel stop region 103 is arranged to be in contact with the second channel stop region 104 under the second channel stop region 104.

Note that the first and second channel stop regions 103 and 104 can be formed in different ion implantation processes. Instead, two channel stop regions may be formed in a single ion implantation process. Alternatively, three or more channel stop regions may be formed below the insulator 105 with the oxide film 201 intervening therebetween. The conductivity type of the first and second channel stop regions 103 and 104 is the second conductivity type. The oxide film 201 between the insulator 105 and second channel stop region 104 may be understood as a part of the element isolation 301.

The insulator 105 may be formed so as to locate its lower end in the semiconductor substrate SB. In this case, the oxide film 201 in the region where the insulator 105 is arranged is removed. When the insulator 105 is formed so as to locate its lower end in the semiconductor substrate SB, the depth of the insulator 105 in the semiconductor substrate SB is preferably small as long as the element isolation 301 does not lose its required element isolation function. The small depth of the insulator 105 in the semiconductor substrate SB is effective to suppress generation of a dark current caused by an etching damage, metal impurity, crystal lattice distortion, crystal defect, or the like.

In the pixel region 100, a plurality of pixels can be arranged to form a plurality of rows and a plurality of columns. Each pixel can include the photoelectric converter 108 and transfer gate 303. The floating diffusion 302, reset transistor 304, and amplifier transistor (not shown) may be arranged for each individual pixel or may be shared by a plurality of pixels.

The peripheral circuit region 200 is located outside the pixel region 100. The peripheral circuit region 200 can include, for example, a row selecting circuit (for example, vertical scanning circuit), readout circuit, column selecting circuit (for example, horizontal scanning circuit), and output unit. The row selecting circuit selects a row in a pixel array formed in the pixel region 100. The readout circuit reads out respective signals output from the pixel array onto a plurality of column signal lines. The column selecting circuit selects a signal read out by the readout circuit. The output unit amplifies and outputs the signal selected by the column selecting circuit.

The peripheral circuit region 200 includes a plurality of transistors 401 and element isolations 219. FIG. 1 illustrates one transistor 401 and one element isolation 219 for the sake of simplicity. The element isolation 219 has an STI structure. The element isolation 219 includes, for example, an insulator 209 filled in a trench formed in the semiconductor substrate SB. The element isolation 219 may include an insulating film 206 arranged between the semiconductor substrate SB and insulator 209.

In recent years, in order to support various readout modes, the scale of peripheral circuits arranged in the peripheral circuit region 200 tends to be increased, and it is required to miniaturize elements (transistors). The element isolation 219 is advantageous for miniaturization since it is formed by forming a trench in the semiconductor substrate SB and filling the insulator 209 in that trench. More specifically, the element isolation 219 formed by forming a trench in the semiconductor substrate SB and filling the insulator 209 in that trench is advantageous for miniaturization since it can almost eliminate differences between dimensions of a designed element isolation and those of the actually formed element isolation. The element isolation 219 formed by forming a trench in the semiconductor substrate SB and filling the insulator 209 in that trench is advantageous since it satisfies insulation characteristics required for electrical isolation between elements.

A method of manufacturing the solid-state image sensor 300 will be exemplarily explained below with reference to FIGS. 2A, 2B, 3A, 3B, 4A, 4B, 5A, 5B, 6, 7A, and 7B. In FIGS. 2A, 2B, 3A, 3B, 4A, 4B, 5A, 5B, 6, 7A, and 7B, the same reference numerals denote members before and after processes for the sake of simplicity. In a process shown in FIG. 2A, an insulating film 202 is formed on the surface of the semiconductor substrate SB made up of silicon by a chemical vapor deposition (to be abbreviated as CVD hereinafter) method or the like. The insulating film 202 is required to form a mask (to be referred to as a hard mask hereinafter), and is formed on both the pixel region 100 and peripheral circuit region 200. The insulating film 202 may be formed on an oxide film (pad oxide film (silicon oxide film)) 201 formed by oxidizing the surface of the semiconductor substrate SB. In one example, the oxide film 201 has a thickness of 15 nm, the insulating film 202 is a silicon nitride film and has a thickness of 170 nm. The thickness of the insulating film 202 is preferably not less than ½ of a depth D of each trench 205 (FIG. 3B; to be described later) formed in the semiconductor substrate SB so as to form the element isolation 219. The following description will be given under the assumption that the oxide film 201 is formed, but the oxide film 201 is not indispensable.

Figure 2A:
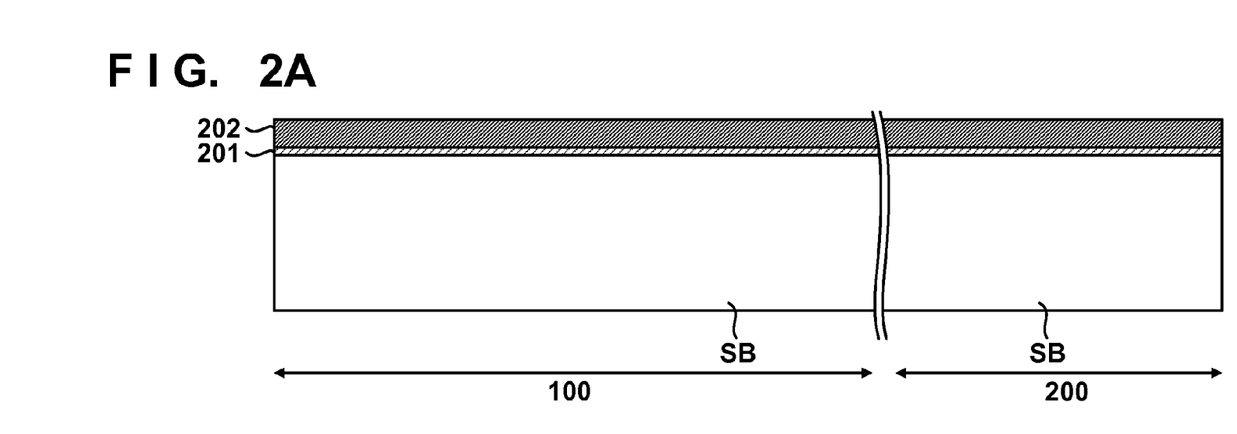
FIGS. 2A and 2B are sectional views for exemplarily explaining a manufacturing method of a solid-state image sensor.
Figure 2B:
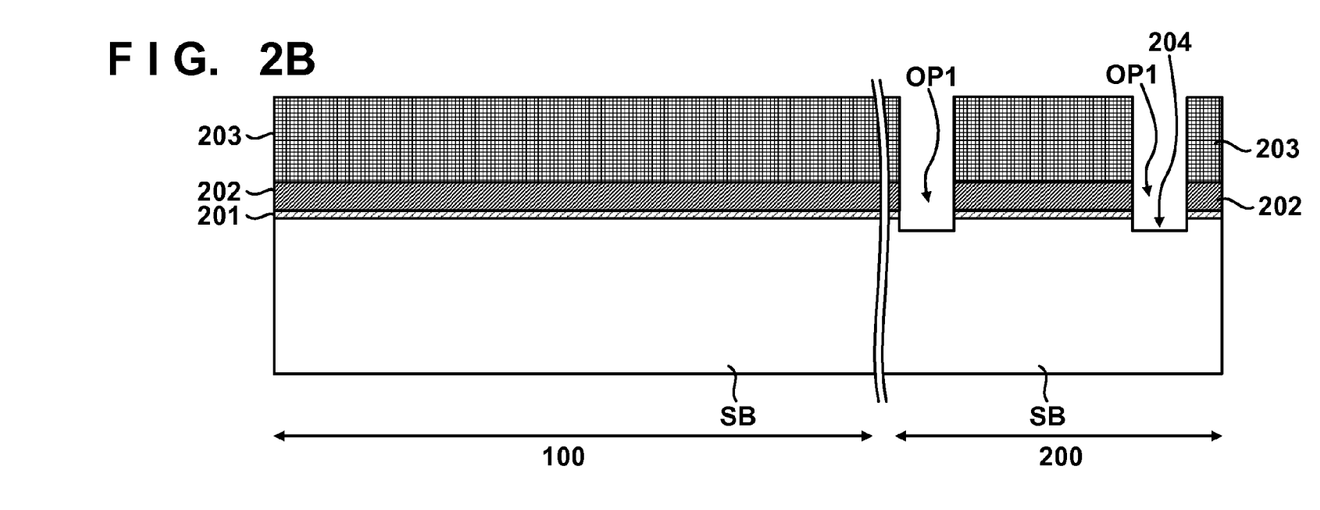

In a process shown in FIG. 2B, first openings OP1 are formed in the insulating film 202 and oxide film 201 in prospective formation regions of the element isolations 219 in the peripheral circuit region 200. More specifically, a resist film is formed on the insulating film 202, and is patterned by a photolithography process, thereby forming a resist pattern 203. Then, anisotropic dry etching is applied to the insulating film 202 and oxide film 201 using the resist pattern 203 as an etching mask, thereby forming the first openings OP1 in the insulating film 202 and oxide film 201. In this case, the surface of the semiconductor substrate SB is also etched through the first openings OP1, and shallow trenches 204 can be formed. The depth of each trench 204 may be, for example, about 40 nm. The insulating film 202 formed with the first openings OP1 is used as a hard mask.

Figure 3A:
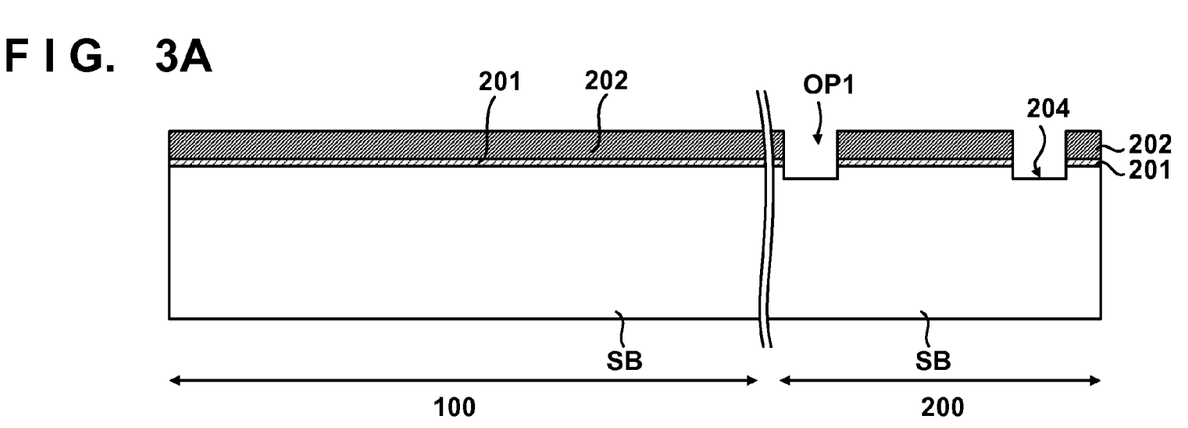
FIGS. 3A and 3B are sectional views for exemplarily explaining a manufacturing method of a solid-state image sensor.
Figure 3B:
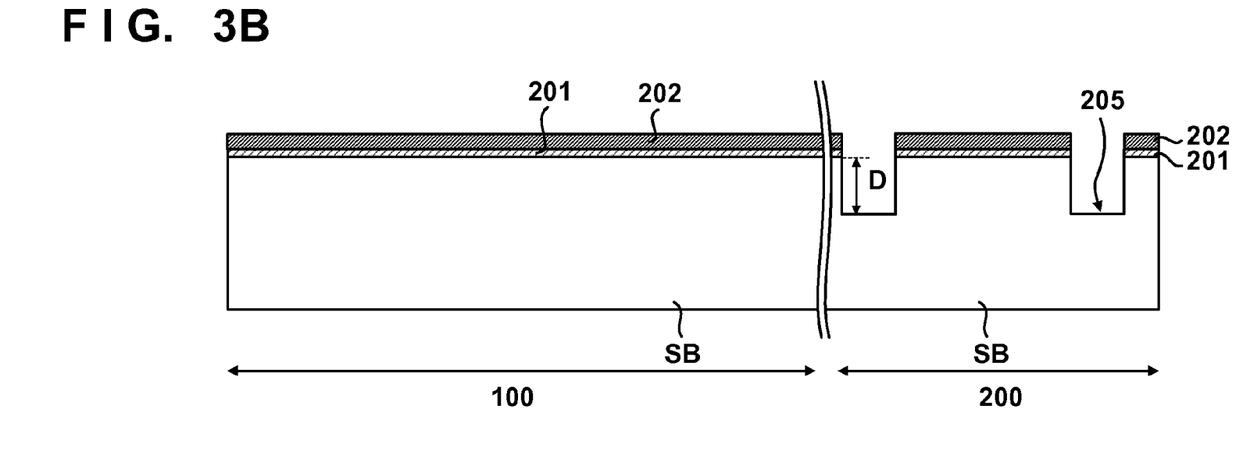

In a process shown in FIG. 3A, the resist pattern 203 is removed. In a process shown in FIG. 3B, using the insulating film 202 as a hard mask, the semiconductor substrate SB is etched through the first openings OP1 of the insulating film 202, thereby forming trenches 205 in the peripheral circuit region 200 of the semiconductor substrate SB. A depth D of each trench 205 formed in the semiconductor substrate SB can be, for example, about 300 nm. The insulating film 202 is also etched when the trenches 205 are formed in the semiconductor substrate SB, and the thickness of the insulating film 202 can be, for example, about 120 nm (when the initial thickness is 170 nm).

Figure 4A:
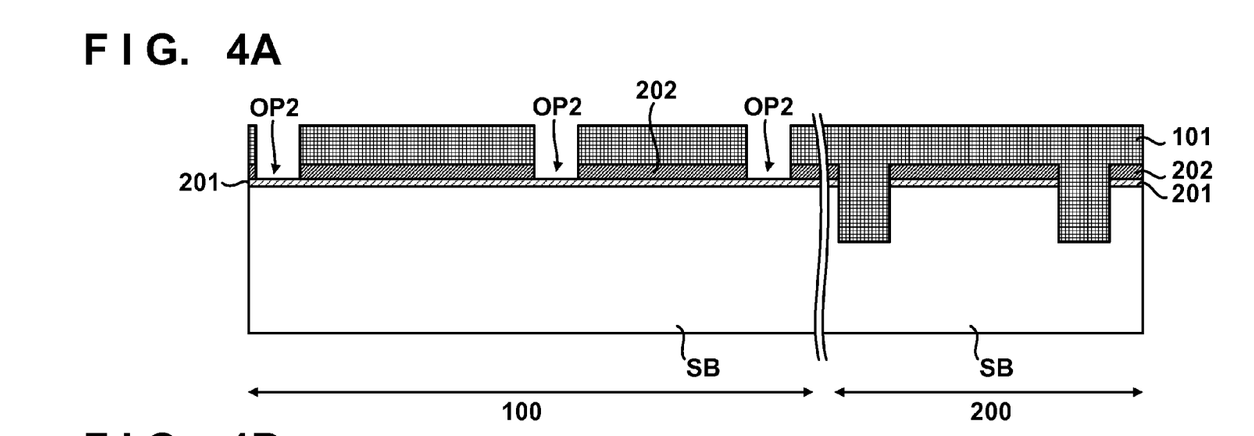
FIGS. 4A and 4B are sectional views for exemplarily explaining a manufacturing method of a solid-state image sensor.

In a process shown in FIG. 4A, second openings OP2 are formed in the insulating film 202 in prospective formation regions of the element isolations 301 in the pixel region 100. More specifically, a resist film is formed on the insulating film 202, and is patterned by a photolithography process, thereby forming a resist pattern 101. Using the resist pattern 101 as an etching mask, anisotropic dry etching is applied to the insulating film 202, thereby forming the second openings OP2 in the insulating film 202. Each second opening OP2 is formed to expose the oxide film 201. Alternatively, etching may be applied to penetrate through the insulating film 202 and to reach a predetermined depth of the oxide film 201 (that is, to form trenches in the oxide film 201). Furthermore, etching may be applied to form trenches in the semiconductor substrate SB.

In this case, when the second openings OP2 are formed in the insulating film 202, if the thickness of the insulating film 202 is an initial thickness (that is, the thickness of the insulating film 202 immediately after the insulating film 202 is formed in the process shown in FIG. 2A), the resist pattern 101 is required to be thickened accordingly. When the resist pattern 101 is thick (that is, the insulating film 202 is an initial thickness), an etching time is prolonged accordingly. When the resist pattern 101 is thick, and the etching time is prolonged, the side surface of each second opening OP2 becomes a forward tapered shape, thus disturbing miniaturization. Hence, the thickness of the insulating film 202 upon formation of the second openings OP2 in the insulating film 202 is preferably not more than ⅘ of the initial thickness. In this embodiment, in the process of etching the semiconductor substrate SB to form the trenches 204 in the semiconductor substrate SB, the insulating film 202 as a hard mask is etched to be thinned. In this case, in the process of forming the trenches 204 in the semiconductor substrate SB, the thickness of the insulating film 202 as a hard mask is preferably thinned to be not more than ⅘ of the thickness before this process is performed.

Figure 4B:
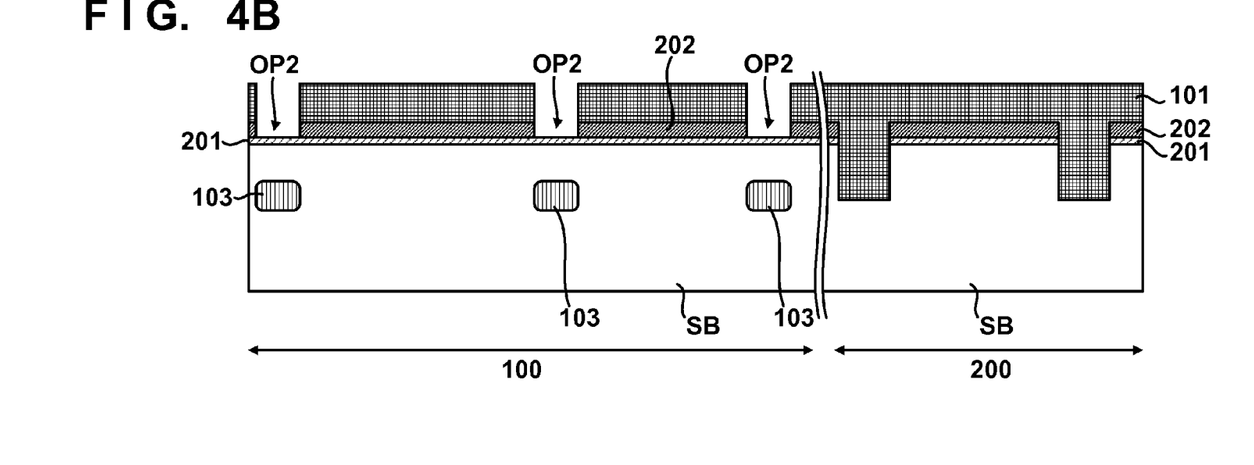

In a process shown in FIG. 4B, ions required to form the second conductivity type (for example boron ions when the second conductivity type is p type) are implanted into the semiconductor substrate SB through the second openings OP2 formed in the insulating film 202, thereby forming the first channel stop regions 103. More specifically, ions can be implanted into the semiconductor substrate SB through the second openings OP2 while leaving the resist pattern 101. The resist pattern 101 has a thickness large enough to prevent ions from being implanted into regions other than those under the second openings OP2 in the semiconductor substrate SB.

Figure 5A:
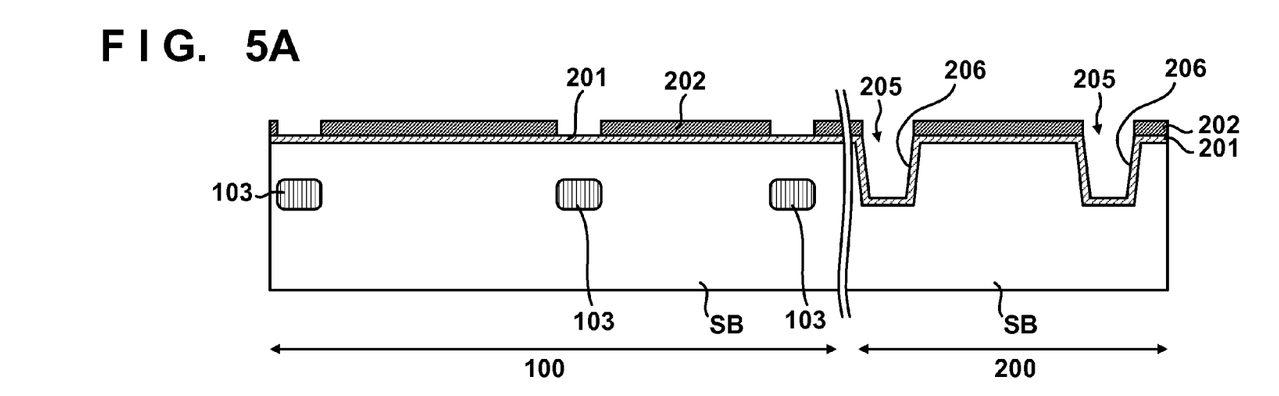
FIGS. 5A and 5B are sectional views for exemplarily explaining a manufacturing method of a solid-state image sensor.

In a process shown in FIG. 5A, the resist pattern 101 is removed, and the insulating film 206 is formed on the side surface and bottom surface of each trench 205 in the peripheral circuit region 200. More specifically, the insulating film (silicon oxide film) 206 can be formed on the side surface and bottom surface of each trench 205 by thermal oxidation in an oxidized gas atmosphere. The thickness of the formed insulating film 206 can be, for example, about 35 nm. In FIG. 5A, the insulating films 206 and 201 are illustrated as an integrated (single) insulating film.

Figure 5B:
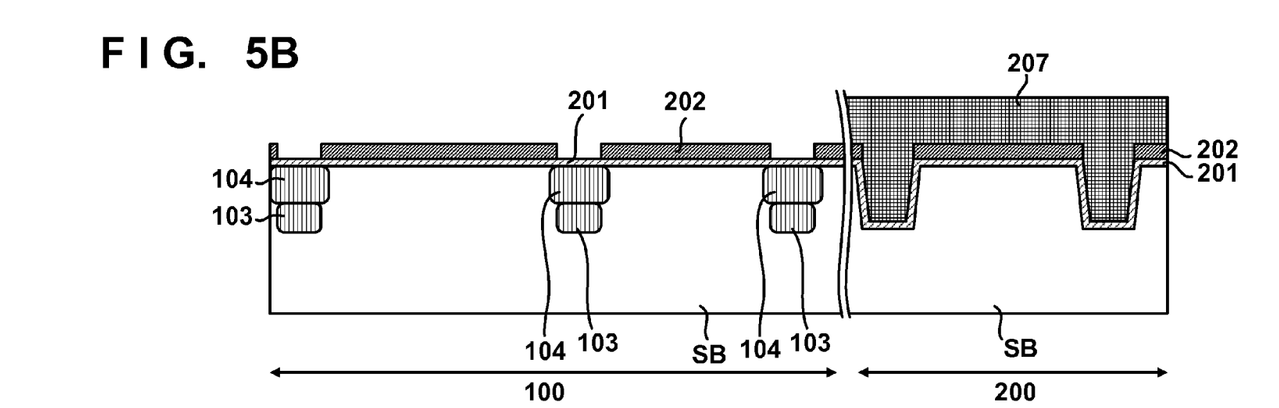

In a process shown in FIG. 5B, the second channel stop regions 104 of the second conductivity type are formed immediately above the first channel stop regions 103 of the second conductivity type formed in the semiconductor substrate SB. More specifically, a resist pattern 207 which exposes the pixel region 100 and covers the peripheral circuit region 200 is formed by a photolithography process, and ions required to form the second conductivity type are implanted immediately above the first channel stop regions 103. Thus, the second channel stop regions 104 can be formed. When the second conductivity type is a p type, the ions required to form the second conductivity type can be, for example, boron ions. The resist pattern 207 has a thickness large enough to prevent ions from being implanted onto the semiconductor substrate SB in the peripheral circuit region 200. The insulating film 202 in the pixel region 100 has a thickness large enough to prevent ions from being implanted into regions other than those immediately above the first channel stop regions 103 in the semiconductor substrate SB.

Figure 6:
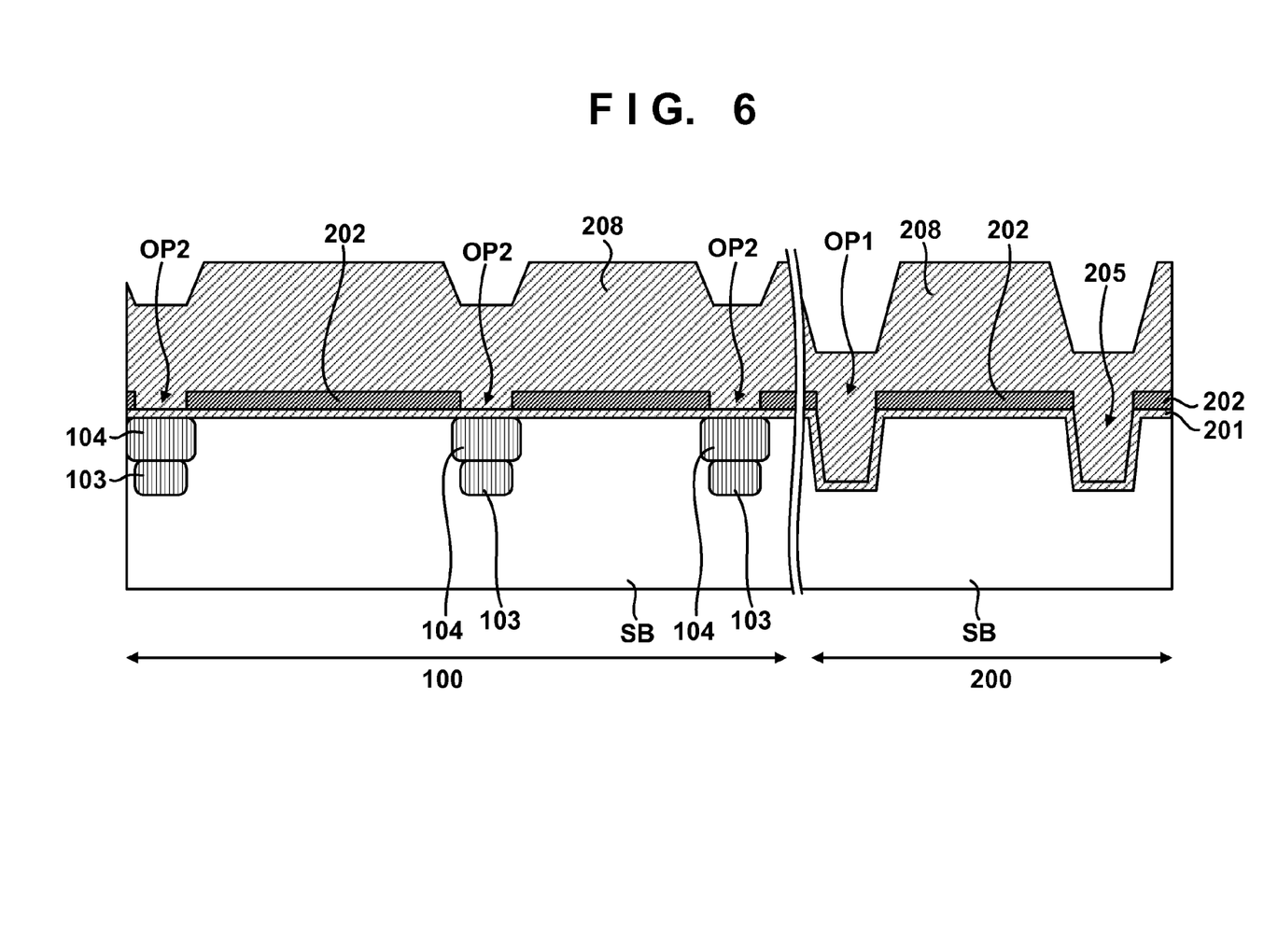
FIG. 6 is a sectional view for exemplarily explaining a manufacturing method of a solid-state image sensor.

In a process shown in FIG. 6, an insulating film 208 is formed to cover the insulating film 202. The insulating film 208 can be, for example, a silicon oxide film formed by a high-density plasma CVD method. The insulating film 208 is formed to fill the second openings OP2 formed in the insulating film 202 of the pixel region 100, the first openings OP1 formed in the insulating film 202 of the peripheral circuit region 200, and the trenches 205 formed in the semiconductor substrate SB of the peripheral circuit region 200.

Figure 7A:
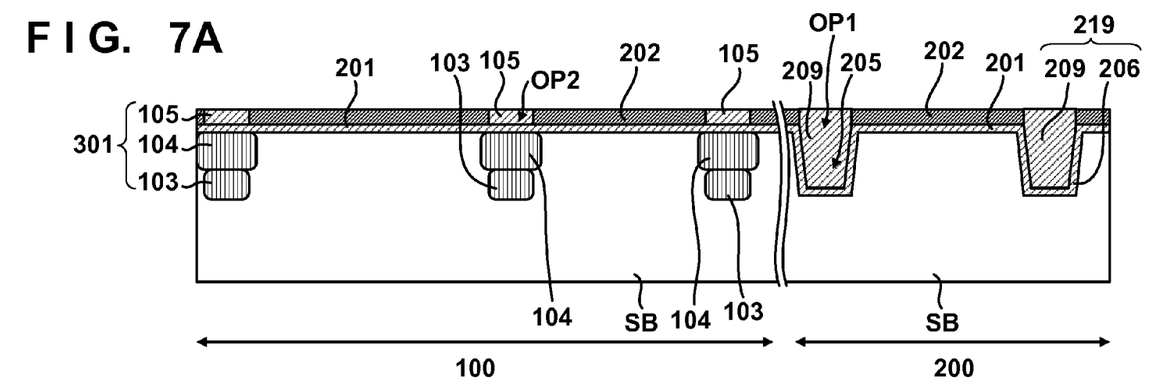
FIGS. 7A and 7B are sectional views for exemplarily explaining a manufacturing method of a solid-state image sensor.

In a process shown in FIG. 7A, a portion, which exists above the upper surface of the insulating film 202, of the insulating film 208 is removed to leave portions, which are arranged in the second openings OP2, first openings OP1, and trenches 205, of the insulating film 208. Thus, the insulators 105 are formed in the second openings OP2 of the insulating film 202 of the pixel region 100, and the insulators 209 are formed in the first openings OP1 of the insulating film 202 of the peripheral circuit region 200 and in the trenches 205 of the semiconductor substrate SB of the peripheral circuit region 200.

The process for removing the portion, which exists above the upper surface of the insulating film 202, of the insulating film 208 can be attained by chemical mechanical polishing (to be abbreviated as CMP hereinafter). In this case, the insulating film 202 functions as a polishing stop layer, and the thickness of the insulating film 202 after CMP can be, for example, 70 nm.

Figure 7B:
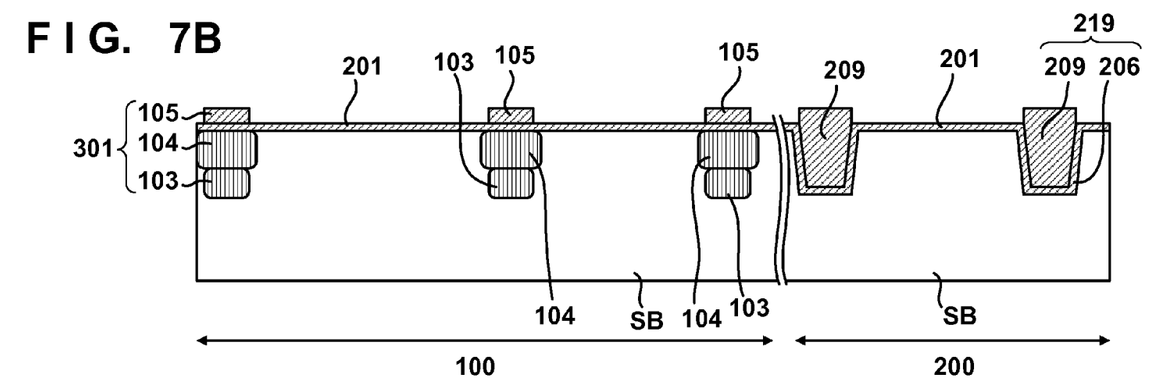

In a process shown in FIG. 7B, the insulating film 202 is removed. More specifically, when the insulating film 202 is a silicon nitride film, and the insulating film 208 (insulators 105 and 209) is silicon oxide, the insulating film 202 can be removed using hot phosphoric acid having a sufficiently low etching rate of a silicon oxide.

Through the aforementioned processes, the element isolations 301 each including the insulators 105, first and second channel stop regions 103 and 104, and the element isolations 219 formed of the insulators 209 buried in the trenches formed in the semiconductor substrate SB are formed.

In subsequent processes, as shown in FIG. 1, after the well 305 of the second conductivity type is formed, the photoelectric converter 108, transfer gate 303, floating diffusion 302, reset transistor 304, and the like are formed on the pixel region 100. Also, the transistors 401 are formed on the peripheral circuit region 200.

As described above, by forming the trenches for the element isolations of the peripheral circuit region using a mask (hard mask) of the insulating film as an etching mask, a problem described in the paragraphs of the related art when a resist mask is used as an etching mask can be solved. Since the hard mask is thinned at the time of formation of the trenches, the hard mask in the pixel region can be easily patterned so as to form element isolations of the pixel region later. This improves processing accuracy of the element isolations of the pixel region. This contributes to miniaturization of elements in the pixel region. Also, by arranging the insulators used to form the element isolations of the pixel region on the semiconductor substrate or by arranging the element isolations of the pixel regions at positions shallower than the insulators used to form the element isolations of the peripheral circuit region, noise in signals read out from pixels can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-196639, filed Sep. 6, 2012, which is hereby incorporated by reference herein in its entirety.

What is claimed is:

1. A method of manufacturing a solid-state image sensor having a pixel region and a peripheral circuit region, comprising:
   forming an oxide film on a semiconductor substrate;
   forming an insulating film on the oxide film;
   forming a first opening in the insulating film and the oxide film in the peripheral circuit region;
   forming a trench in the semiconductor substrate in the peripheral circuit region by etching the semiconductor substrate through the first opening using the insulating film as a mask;
   forming a second opening in the insulating film to penetrate through the insulating film in the pixel region and not to penetrate through the oxide film; and
   forming insulators in the trench and in the second opening after the forming of the trench and the forming of the second opening.

2. The method according to claim 1, wherein in the forming of the trench, the insulating film is thinned, and the forming of the second opening is performed after the forming of the trench.

3. The method according to claim 1, wherein in the forming of the second opening, the second opening is formed in the insulating film to expose the oxide film.

4. The method according to claim 1, wherein in the forming of the insulating film, the insulating film is formed to have a thickness of not less than ½ of a depth of the trench.

5. The method according to claim 1, wherein in the forming of the trench, a thickness of the insulating film is thinned to not more than ⅘ of a thickness before the forming of the trench is performed.

6. The method according to claim 1, further comprising forming a channel stop region by implanting ions into the semiconductor substrate in the pixel region through the second opening.

7. The method according to claim 1, wherein the forming of the insulators includes forming a film for forming the insulators such that the trench and the second opening are filled with the film for forming the insulators.

8. The method according to claim 1, wherein the forming of the insulators includes forming a film for forming the insulators such that the trench, the first opening, and the second opening are filled with the film for forming the insulators, and performing chemical mechanical polishing against the film for forming the insulators.

9. The method according to claim 8, wherein the chemical mechanical polishing is performed by using the insulating film as a polishing stop layer.

10. The method according to claim 8, wherein the insulating film is a silicon nitride film.

11. The method according to claim 1, further comprises forming another oxide film on a side surface and a bottom surface of the trench by thermal oxidation, after the forming of the second opening.

12. A method of manufacturing a solid-state image sensor having a pixel region and a peripheral circuit region, comprising:
    forming an insulating film on a semiconductor substrate;
    forming a first opening in the insulating film in the peripheral circuit region;
    forming a trench in the semiconductor substrate in the peripheral circuit region by etching the semiconductor substrate through the first opening using the insulating film as a mask;
    forming a second opening in the insulating film to penetrate through the insulating film in the pixel region after the forming of the trench; and
    forming insulators in the trench and in the second opening after the forming of the trench and the forming of the second opening,
    wherein in the forming of the trench, the insulating film is thinned in the pixel region.

13. The method according to claim 12, further comprises forming a resist pattern on the insulating film, etching the insulating film using the resist pattern as an etching mask for forming the first opening, and removing the resist pattern before the forming of the trench.

14. The method according to claim 12, wherein the forming of the second opening is performed such that the second opening reaches the semiconductor substrate.

15. The method according to claim 12, wherein in the forming of the insulating film, the insulating film is formed to have a thickness of not less than ½ of a depth of the trench.

16. The method according to claim 12, wherein in the forming of the trench, a thickness of the insulating film is thinned to not more than ⅘ of a thickness before the forming of the trench is performed.

17. The method according to claim 12, further comprising forming a channel stop region by implanting ions into the semiconductor substrate in the pixel region through the second opening.

18. The method according to claim 12, wherein the forming of the insulators includes forming a film for forming the insulators such that the trench and the second opening are filled with the film for forming the insulators.

19. The method according to claim 12, further comprises forming an oxide film on a side surface and a bottom surface of the trench by thermal oxidation.

20. The method according to claim 19, wherein the forming of the oxide film is performed after the forming the second opening.

* * * * *